United States Patent
Nishizawa

(10) Patent No.: US 7,880,092 B2
(45) Date of Patent: Feb. 1, 2011

(54) MULTILAYER CERAMIC ELECTRONIC COMPONENT

(75) Inventor: Yoshihiko Nishizawa, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 164 days.

(21) Appl. No.: 12/269,143

(22) Filed: Nov. 12, 2008

(65) Prior Publication Data
US 2009/0068445 A1 Mar. 12, 2009

Related U.S. Application Data

(63) Continuation of application No. PCT/JP2007/061773, filed on Jun. 12, 2007.

(30) Foreign Application Priority Data
Jun. 23, 2006 (JP) .............................. 2006-173457

(51) Int. Cl.
H05K 1/00 (2006.01)
H01F 17/04 (2006.01)

(52) U.S. Cl. ................... 174/255; 174/256; 174/258; 174/260; 361/321.1; 361/321.5; 361/760; 361/762; 361/764; 428/210; 428/697; 428/699; 336/177; 336/233

(58) Field of Classification Search .............. 428/210; 361/321, 760, 762, 764, 321.1, 321.5; 174/255, 174/256, 258, 260; 336/177, 200, 233
See application file for complete search history.

(56) References Cited

U.S. PATENT DOCUMENTS

| | | | |
|---|---|---|---|
| 4,672,152 A * | 6/1987 | Shinohara et al. | 174/258 |
| 6,228,196 B1 * | 5/2001 | Sakamoto et al. | 156/89.17 |
| 6,395,118 B1 * | 5/2002 | Sakamoto et al. | 156/89.12 |
| 6,426,551 B1 * | 7/2002 | Kawakami et al. | 257/700 |
| 6,489,877 B1 * | 12/2002 | Yamamoto et al. | 336/200 |
| 6,741,154 B2 * | 5/2004 | Kawasaki et al. | 336/200 |
| 6,814,883 B2 * | 11/2004 | Marusawa | 252/62.63 |
| 6,914,513 B1 * | 7/2005 | Wahlers et al. | 336/233 |
| 2003/0091841 A1 | 5/2003 | Marusawa | |

FOREIGN PATENT DOCUMENTS

| | | |
|---|---|---|
| JP | 05-275240 A | 10/1993 |
| JP | 09-167703 A | 6/1997 |
| JP | 2000-294423 A | 10/2000 |
| JP | 2003-243243 A | 8/2003 |
| JP | 2003-272914 A | 9/2003 |
| JP | 2005-166816 A | 6/2005 |

OTHER PUBLICATIONS

Official Communication issued in International Patent Application No. PCT/JP2007/061773, mailed on Sep. 18, 2007.

* cited by examiner

Primary Examiner—Cathy Lam
(74) Attorney, Agent, or Firm—Keating & Bennett, LLP

(57) ABSTRACT

In a multilayer ceramic electronic component, a ferrite ceramic material defining a base layer includes bismuth. Meanwhile, surface layers arranged on main surfaces of the base layer have a composition that is substantially free from bismuth. The surface layers have a zinc content greater than that of the base layer. This results in satisfactory sinterability even when bismuth is included in the surface layers.

9 Claims, 2 Drawing Sheets

MULTILAYER CERAMIC ELECTRONIC COMPONENT

BACKGROUND OF THE INVENTION

1. Field of the Invention

The present invention relates to multilayer ceramic electronic components, and, in particular, to a multilayer ceramic electronic component including stacked ferrite ceramic layers.

2. Description of the Related Art

Ferrite ceramic materials are often used to form main bodies defining inductor components. Usually, conductive films used for terminals or portions of coil conductors are arranged on a surface of a main body. The conductive films are, for example, thick films formed by applying a conductive paste including silver and baking the paste. Such conductive films that are made of the thick films including silver, in particular, the conductive films defining terminals often cause a problem of solder leaching when bonded to a circuit board by soldering. Thus, the conductive films including silver are usually subjected to nickel plating. Furthermore, to improve solderability, tin, solder, or gold plating is performed.

The nickel plating and tin plating are performed by electroplating. However, the following problem may arise when performing the electroplating.

The ferrite ceramic material defining the main body of the inductor component typically has a relatively low resistivity as compared to, for example, insulating ceramic materials. Thus, the anomalous deposition of plating films, in which the plating films are deposited on the conductive film and a surface of the main body other than the conductive film, may occur when the electroplating is performed. The anomalous deposition of the plating films leads to, for example, a reduction in the distance between the terminals made of the conductive films. In particular, for small-sized inductor components, this may cause a reduction in withstand voltage and, in the worst case, a short-circuit failure.

The related art is described in Japanese Unexamined Patent Application Publication No. 2003-272914. Patent Application Publication No. 2003-272914 describes a multilayer inductor component including a main body having a multilayer structure made of a ferrite ceramic material to which bismuth is added as a sintering agent. The addition of bismuth as a sintering agent permits the ferrite ceramic material to be sintered at a lower temperature. Therefore, internal conductors made of silver can be used.

However, for the multilayer inductor component as described in Patent Application Publication No. 2003-272914, when the conductive films arranged on the outer surfaces of the main body are subjected to electroplating, the foregoing anomalous deposition of the plating films occurs more readily. The anomalous deposition was determined to be attributed to the bismuth. It was determined that bismuth was present in the form of $Bi_2O_3$ at boundaries of the ferrite ceramic material and the anomalous deposition of the plating films typically occurred at the boundaries at which bismuth was present on the surfaces of the main body.

SUMMARY OF THE INVENTION

To overcome the problems described above, preferred embodiments of the present invention provide a multilayer ceramic electronic component including stacked ferrite ceramic layers in which the anomalous deposition of a plating film is prevented while good sinterability at a relatively low temperature is achieved.

A multilayer ceramic electronic component according to a preferred embodiment of the present invention includes a base layer made of a ferrite ceramic material, a surface layer arranged on at least one main surface of the base layer and made of a ferrite ceramic material, and a surface conductive film arranged on a main surface of the surface layer facing outward. To overcome the foregoing technical problems, the ferrite ceramic material defining the base layer includes a plurality of metals including bismuth, and the ferrite ceramic material defining the surface layer is substantially free from bismuth.

Preferably, both of the base layer and the surface layer include zinc, and the surface layer has a greater zinc content than the base layer.

Preferably, the ferrite ceramic material defining the surface layer has substantially the same compositional system as the ferrite ceramic material defining the base layer, in other words, a plurality of main constituents are substantially identical, except that the ferrite ceramic material defining the surface layer is substantially free from bismuth.

Preferably, the surface layer has a thickness of at least about 30 μm, for example.

Preferably, a diffusion barrier layer arranged to prevent the diffusion of bismuth is arranged between the surface conductive film and the base layer. In this case, preferably, the surface layer has a thickness of at least about 15 μm, for example. That is, the lower limit of the thickness of the surface layer can be reduced. Furthermore, the diffusion barrier layer is preferably made of the surface conductive film.

Preferred embodiments of the present invention are particularly advantageously applied to a multilayer ceramic electronic component including the surface conductive film that is covered with a plating film.

The multilayer ceramic electronic component according to preferred embodiments of the present invention may preferably further include a surface-mounted electronic component electrically connected to the surface conductive film.

According to preferred embodiments of the present invention, the ferrite ceramic material defining the base layer includes bismuth, and the ferrite ceramic material defining the surface layer is substantially free from bismuth. Thus, bismuth is not substantially present on the surfaces of the multilayer ceramic electronic component, i.e., the surfaces exposed to a plating solution. Thus, the multilayer ceramic electronic component has an increased surface resistance. As a result, a leakage current from the surface conductive film does not easily flow, which prevents the anomalous deposition of a plating film on the surfaces of the multilayer ceramic electronic component. Therefore, this arrangement prevents a reduction in the withstand voltage between the surface conductive films due to the anomalous deposition of the plating film and the occurrence of short-circuit failure. Thereby, a highly reliable multilayer ceramic electronic component can be provided.

According to preferred embodiments of the present invention, the surface layer that prevents the anomalous diffusion of the plating film can be simply formed by preparing bismuth-free green sheets and stacking the green sheets when the multilayer ceramic electronic component is produced by a green sheet process similar to the method in the related art. Thus, it is possible to produce the multilayer ceramic electronic component in which the anomalous deposition of the plating film is prevented without a reducing the yield or increasing in cost.

That is, according to preferred embodiments of the present invention, for example, there is no need to subject a laminate before or after firing to a special treatment to overcome the problem of the anomalous deposition of the plating film. Thus, preferred embodiments of the present invention eliminates the problems of an increase in the number of steps due to the treatment, an increase in cost, difficulty in appropriately and uniformly performing the treatment, the occurrence of another problem due to the treatment, and other potential problems.

In an arrangement in which both of the base layer and the surface layer include zinc, when the surface layer has a zinc content greater than that of the base layer, satisfactory sinterability can be provided in the surface layer even when the surface layer is free from bismuth.

When the surface layer has a thickness of at least about 30 μm, bismuth does not reach the main surface of the surface layer facing outward even when bismuth diffuses from the base layer. Thus, it is possible to reliably provide the multilayer ceramic electronic component in which the anomalous deposition of the plating film is prevented.

The arrangement of the diffusion barrier layer to prevent the diffusion of bismuth in the base layer between the surface conductive film and the base layer can effectively prevent the diffusion of bismuth from the base layer toward the surface conductive film.

Furthermore, when the diffusion barrier layer is arranged, the thickness of the surface layer required to stably prevent the anomalous deposition of the plating film can be reduced to about 15 μm, for example. This advantageously enables a reduction in the profile of the multilayer ceramic electronic component.

The diffusion barrier layer is defined by the internal conductive film and thus can be formed in the same manner as in another internal conductive film, to thereby eliminate the need for a special material or step to form the diffusion barrier layer.

When the multilayer ceramic electronic component according to preferred embodiments of the present invention further includes a surface-mounted electronic component electrically connected to the surface conductive film, it is possible to provide a highly reliable module component without a reduced withstand voltage between the surface conductive films or a short-circuit failure.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
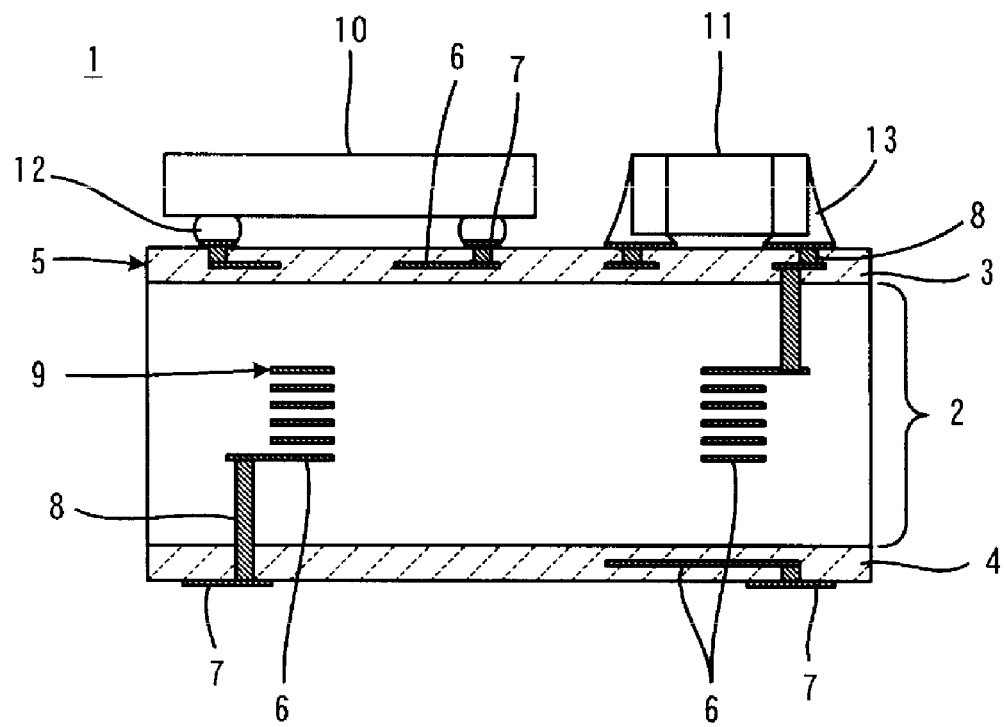
FIG. 1 is a cross-sectional view of a multilayer ceramic electronic component according to a first preferred embodiment of the present invention.

FIG. 1 is a cross-sectional view of a multilayer ceramic electronic component 1 according to a first preferred embodiment of the present invention.

The multilayer ceramic electronic component 1 includes a ceramic laminate 5 with a multilayer structure having a base layer 2 made of a ferrite ceramic material and surface layers 3 and 4 arranged on respective upper and lower main surfaces of the base layer 2 and made of a ferrite ceramic material.

The multilayer ceramic electronic component 1 also includes conductive patterns arranged inside and outside the ceramic laminate 5. The conductive patterns are broadly divided into internal conductive films 6, surface conductive films 7, and interlayer connection conductors 8. The internal conductive films 6 and the surface conductive films 7 are arranged on main surfaces of stacked ceramic green sheets defining the base layer 2 or the surface layer 3 or 4 during the production of the multilayer ceramic electronic component 1. The interlayer connection conductors 8 are arranged to extend through the ceramic green sheets in the thickness direction.

The internal conductive films 6 are arranged in the ceramic laminate 5. The surface conductive films 7 are arranged on main surfaces of the ceramic laminate 5, i.e., main surfaces of the surface layers 3 and 4 that face outward.

Combinations of specific internal conductive films 6 and specific interlayer connection conductors 8 define coil patterns 9 in the base layer 2. The interlayer connection conductors 8 that partially define the coil patterns 9 are not shown in FIG. 1.

The multilayer ceramic electronic component 1 defines, for example, a DC-DC converter and includes surface-mounted electronic components 10 and 11 mounted on the main surface of the surface layer 3 facing outward. The electronic component 10 is, for example, an IC chip electrically connected to the surface conductive films 7 arranged on the main surface of the surface layer 3 facing outward through solder bumps 12. The other electronic component 11 is, for example, a chip capacitor electrically connected to the surface conductive films 7 arranged on the main surface of the surface layer 3 facing outward with solder 13. The surface conductive films 7 arranged on the main surface of the lower surface layer 4 facing outward defines terminal electrodes used when the multilayer ceramic electronic component 1 is mounted on a motherboard, not shown.

The ferrite ceramic material defining the base layer 2 includes a plurality of metal elements including bismuth. In contrast, the ferrite ceramic material defining the surface layers 3 and 4 is substantially free from bismuth. Preferably, the ferrite ceramic material defining the surface layers 3 and 4 and the ferrite ceramic material defining the base layer 2 have substantially the same compositional system, in other words, a plurality of main constituents are substantially identical, except that the ferrite ceramic material defining the surface layers 3 and 4 is substantially free from bismuth. Each of the base layer 2 and the surface layers 3 and 4 includes zinc. The surface layers 3 and 4 preferably have a zinc content greater than that of the base layer 2.

An example of a raw material powder used to form the ferrite ceramic material defining the base layer 2 is a mixture preferably including ferric oxide ($Fe_2O_3$), zinc oxide (ZnO), nickel oxide (NiO), and copper oxide (CuO) in predetermined proportions, and further including $Bi_2O_3$ as a sintering agent. In this case, for example, the resulting ferrite ceramic material can preferably have a relative permeability of about 150 at 1 MHz.

A raw material powder used to form the ferrite ceramic material ding the surface layers 3 and 4 is based on the composition of the above-described raw material powder for the base layer 2 without $Bi_2O_3$. In this case, to improve its sinterability, the raw material powder has a higher zinc content as compared to the base layer 2. For example, a mixture including ferric oxide, zinc oxide, and copper oxide, which are substantially the same as the main constituents of the base layer 2, in predetermined proportions can be used as the raw material powder. For example, a ferrite ceramic material prepared from the raw material powder preferably has a relative permeability of about 1 at 1 MHz.

In this preferred embodiment, the ferrite ceramic materials preferably have the Fe—Ni—Zn—Cu-based and Fe—Zn—Cu-based compositions. Alternatively, other compositions, such as an Fe—Mn—Zn-based composition, may be used.

A method for producing the multilayer ceramic electronic component 1 will be described below.

Ceramic green sheets to be formed into the base layer 2 and the surface layers 3 and 4 are prepared. These ceramic green sheets are provided by adding a binder, a plasticizer, a wetting agent, a dispersant, and other ingredients to the ferrite ceramic raw material powders described above to form a slurry and forming the slurry into sheets.

Through holes are formed in specific ceramic green sheets. The through holes are filled with a conductive paste to form unsintered interlayer connection conductors 8. The conductive paste is applied on specific ceramic green sheets by printing to form unsintered internal conductive films 6 and surface conductive films 7. The conductive paste to form the internal conductive films 6, the surface conductive films 7, and the interlayer connection conductors 8 preferably includes a conductive metal primarily made of silver or silver/palladium.

To form the base layer 2 and the surface layers 3 and 4, predetermined numbers of ceramic green sheets are stacked in a predetermined order and press-bonded to form an unsintered ceramic laminate 5.

When the foregoing steps are performed to form a source ceramic laminate configured to simultaneously produce a plurality of multilayer ceramic electronic components 1, grooves to facilitate the separation of the source ceramic laminate are formed.

The unsintered ceramic laminate is fired to form the sintered ceramic laminate 5. At this point, the ceramic green sheets to be formed into the bismuth-free surface layers 3 and 4 have a zinc content greater than that of the ceramic green sheets to be formed into the base layer 2, and thus, have satisfactory sinterability.

The surface conductive films 7 exposed at the surfaces of the ceramic laminate 5 are subjected to a plating treatment. Specifically, electroplating is preferably performed to form nickel plating films and then gold plating films. In this electroplating step, the surface layers 3 and 4 are substantially free from bismuth. As a result, bismuth is not present on the main surfaces of the surface layers 3 and 4 facing outward, so that the surface resistance is increased, thereby not causing anomalous deposition of the plating film. The plating treatment may be performed by electroless plating. In this case, for example, nickel plating films and gold plating films are formed in that order.

The surface-mounted electronic components 10 and 11 are mounted on the upper main surface of the ceramic laminate 5 so as to be electrically connected to the surface conductive films 7.

When the foregoing steps are performed to the source ceramic laminate, the step of separating the source ceramic laminate along the grooves into individual multilayer ceramic electronic components 1 is performed. A metal cover, not shown, is attached to each of the multilayer ceramic electronic components 1, as required.

In the foregoing description, the grooves are formed before the firing step. Alternatively, the source ceramic laminate may be separated into individual unsintered ceramic laminates 5 for the multilayer ceramic electronic components 1 before the firing step without forming grooves. In this case, the firing step is performed on the individual ceramic laminates 5. For the plating treatment, electroplating, such as barrel plating, is preferably performed.

In the resulting multilayer ceramic electronic component 1, each of the surface layers 3 and 4 preferably has a thickness of at least about 30 μm, for example. A thickness of less than about 30 μm may cause the diffusion of bismuth from the base layer 2 to the main surfaces of the surface layers 3 and 4 facing outward. At a thickness of at least about 30 μm, bismuth does not reach the main surfaces facing outward even when bismuth diffuses from the base layer 2, thus reliably preventing the anomalous deposition of the plating film.

Figure 2:
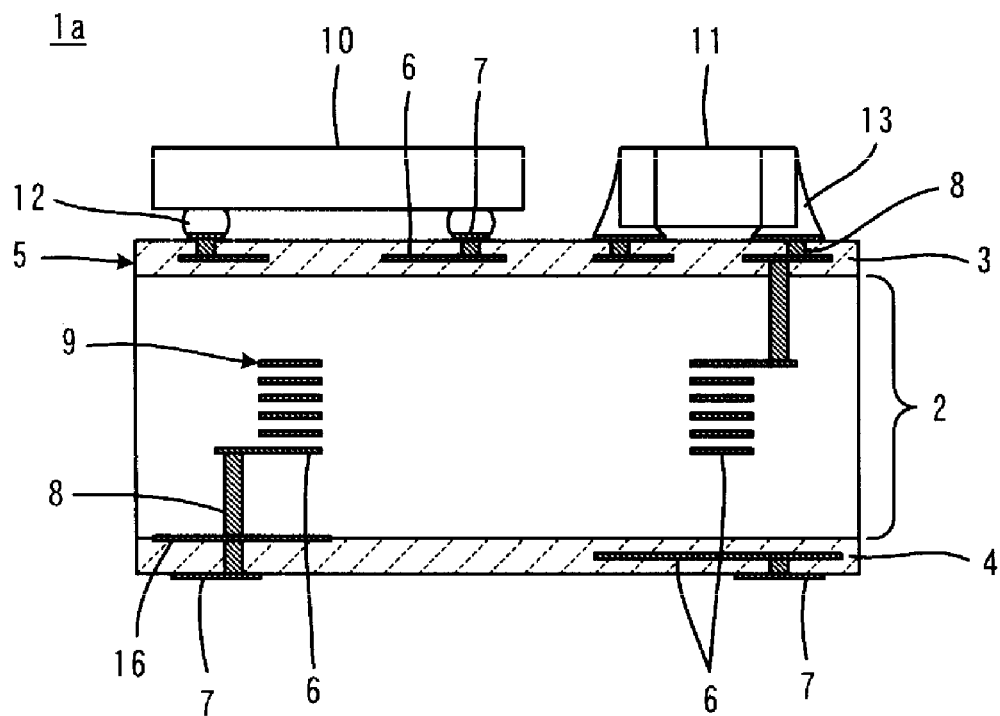
FIG. 2 is a cross-sectional view of a multilayer ceramic electronic component according to a second preferred embodiment of the present invention.

FIG. 2 shows a multilayer ceramic electronic component 1a according to a second preferred embodiment of the present invention and corresponds to FIG. 1. In FIG. 2, elements that are equivalent to those shown in FIG. 1 are designated by the same reference numerals, and descriptions thereof are omitted.

In the multilayer ceramic electronic component 1a shown in FIG. 2, different measures are taken to prevent the diffusion of bismuth in the base layer 2, as compared to the multilayer ceramic electronic component 1 shown in FIG. 1.

In the multilayer ceramic electronic component 1 shown in FIG. 1, the internal conductive films 6 located in the surface layers 3 and 4 and near the surface conductive films 7 prevent the diffusion of bismuth in the base layer 2 to a certain extent. To further improve this the effect, in this preferred embodiment, as is clear from a comparison of FIG. 2 and 1, the area of each of the internal conductive films 6 located near a corresponding one of the surface conductive films 7 is increased. When the internal conductive films 6 are not arranged near the surface conductive films 7, another internal conductive film defining a diffusion barrier layer 16 is provided. For example, the diffusion barrier layer 16 is disposed along the interface between the base layer 2 and the surface layer 4.

With the arrangement described above, the anomalous deposition of the plating film on the main surfaces of the surface layers 3 and 4 facing outward can be prevented even when the thickness of each of the surface layers 3 and 4 is reduced to about 15 μm, for example. Therefore, the profile of the multilayer ceramic electronic component 1a can be advantageously reduced.

Figure 3:
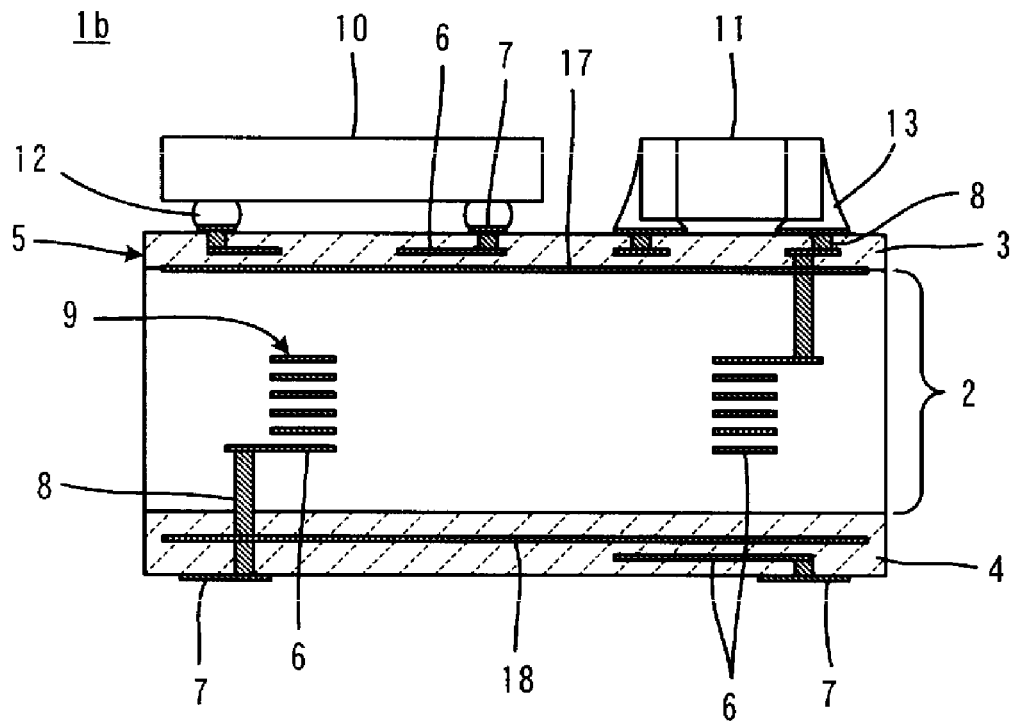
FIG. 3 is a cross-sectional view of a multilayer ceramic electronic component according to a third preferred embodiment of the present invention.

FIG. 3 shows a multilayer ceramic electronic component 1b according to a third preferred embodiment of the present invention and corresponds to FIGS. 1 and 2. In FIG. 3, elements that are equivalent to those shown in FIG. 1 or 2 are designated by the same reference numerals, and descriptions thereof are omitted.

The multilayer ceramic electronic component 1b shown in FIG. 3 prevents the diffusion of bismuth in the base layer 2.

In the multilayer ceramic electronic component 1b shown in FIG. 3, a diffusion barrier layer 17 having a relatively large area is arranged along the interface between the base layer 2 and the surface layer 3, and a diffusion barrier layer 18 having a relatively large area is arranged in the surface layer 4. The diffusion barrier layers 17 and 18 are made of internal conductive films. The arrangement of the diffusion barrier layers 17 and 18 provides substantially the same effect as that in the multilayer ceramic electronic component 1a.

Each of the diffusion barrier layers 17 and 18 having a large area can also define, for example, capacitor electrodes or ground potential electrodes. In this case, the multilayer ceramic electronic component 1*b* prevents the diffusion of bismuth without requiring any design change.

Although the preferred embodiments shown in FIGS. 1 to 3 have been described above, various changes may be made within the scope of the present invention.

For example, the multilayer ceramic electronic components 1, 1*a*, and 1*b* shown in the figures are multi-function composite components including the surface-mounted components 10 and 11 mounted on the ceramic laminates 5. Alternatively, preferred embodiments of the present invention can also be applied to, for example, a chip inductor as shown in FIG. 4.

Figure 4:
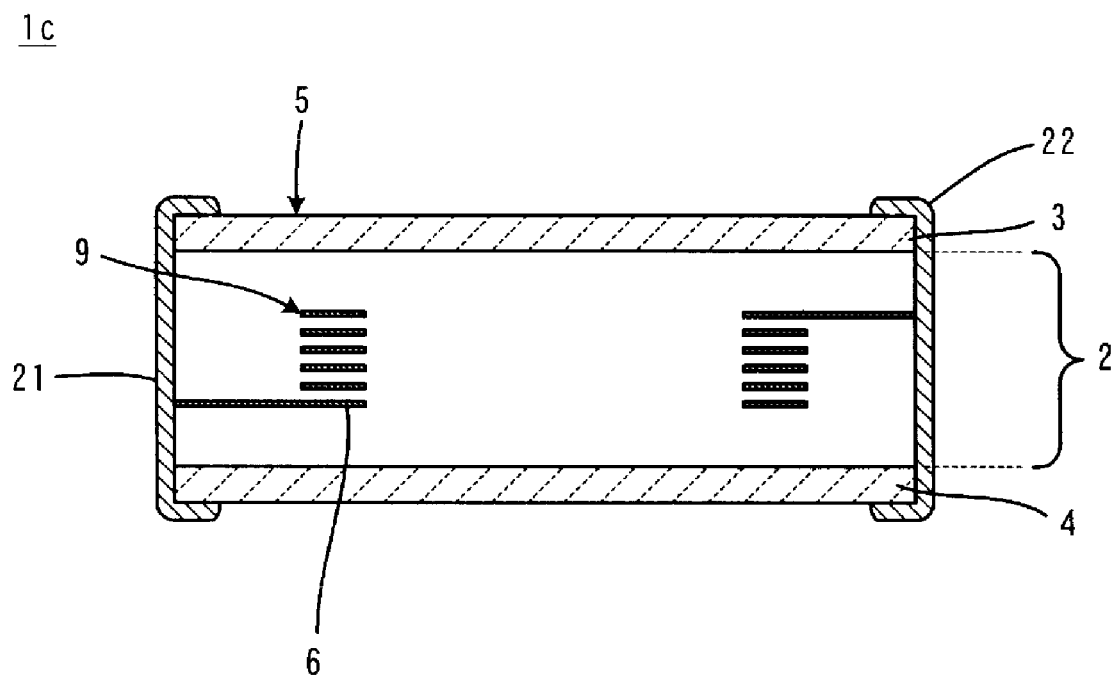
FIG. 4 is a cross-sectional view of a multilayer ceramic electronic component according to a fourth preferred embodiment of the present invention.

FIG. 4 is a cross-sectional view of a multilayer ceramic electronic component 1*c* defining a chip inductor according to a fourth preferred embodiment of the present invention. In FIG. 4, elements that are equivalent to those shown in FIG. 1 are designated by the same reference numerals, and descriptions thereof are omitted.

In the multilayer ceramic electronic component 1*c* defining a chip inductor shown in FIG. 4, terminal conductive films 21 and 22 are arranged on both end surfaces of the ceramic laminate 5. Each of the end portions of the coil patterns 9 extends to a corresponding one of the end surfaces of the ceramic laminate 5 and is electrically connected to a corresponding one of the terminal conductive films 21 and 22. Each of the terminal conductive films 21 and 22 partially define surface conductive films on main surfaces of the surface layers and 4.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic electronic component comprising:
   a base layer made of a ferrite ceramic material;
   a surface layer arranged on at least one main surface of the base layer and made of a ferrite ceramic material; and
   a surface conductive film arranged on a main surface of the surface layer facing outward; wherein
   the ferrite ceramic material defining the base layer includes a plurality of metals including bismuth; and
   the ferrite ceramic material defining the surface layer is substantially free from bismuth.

2. The multilayer ceramic electronic component according to claim 1, wherein both of the base layer and the surface layer include zinc, and the surface layer has a zinc content greater than that of the base layer.

3. The multilayer ceramic electronic component according to claim 1, wherein the ferrite ceramic material defining the surface layer has substantially the same compositional system as the ferrite ceramic material defining the base layer, except that the ferrite ceramic material defining the surface layer is substantially free from bismuth.

4. The multilayer ceramic electronic component according to claim 1, wherein the surface layer has a thickness of at least about 30 µm.

5. The multilayer ceramic electronic component according to claim 1, further comprising a diffusion barrier layer arranged between the surface conductive film and the base layer, the diffusion barrier layer being arranged to prevent diffusion of the bismuth.

6. The multilayer ceramic electronic component according to claim 5, wherein the surface layer has a thickness of at least about 15 µm.

7. The multilayer ceramic electronic component according to claim 5, wherein the diffusion barrier layer is made of the surface conductive film.

8. The multilayer ceramic electronic component according to claim 1, further comprising a plating film disposed on the surface conductive film.

9. The multilayer ceramic electronic component according to claim 1, further comprising a surface-mounted electronic component electrically connected to the surface conductive film.

* * * * *